(12) United States Patent
Chen

(10) Patent No.: US 9,564,419 B2
(45) Date of Patent: Feb. 7, 2017

(54) SEMICONDUCTOR PACKAGE STRUCTURE AND METHOD FOR MANUFACTURING THE SAME

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/669,015

(22) Filed: Mar. 26, 2015

(65) Prior Publication Data

US 2016/0284668 A1    Sep. 29, 2016

(51) Int. Cl.
| | | |
|---|---|---|
| *H01L 23/48* | (2006.01) | |
| *H01L 25/065* | (2006.01) | |
| *H01L 25/00* | (2006.01) | |
| *H01L 23/00* | (2006.01) | |

(52) U.S. Cl.
CPC ......... *H01L 25/0657* (2013.01); *H01L 23/481* (2013.01); *H01L 24/02* (2013.01); *H01L 25/50* (2013.01); *H01L 2224/0239* (2013.01); *H01L 2224/02372* (2013.01); *H01L 2225/06548* (2013.01); *H01L 2225/06562* (2013.01); *H01L 2225/06582* (2013.01); *H01L 2924/01029* (2013.01); *H01L 2924/01074* (2013.01)

(58) Field of Classification Search
CPC .............................. H01L 23/481; H01L 25/50
See application file for complete search history.

(56) References Cited

U.S. PATENT DOCUMENTS

| | | |
|---|---|---|
| 8,558,394 B1 | 10/2013 | Chen |
| 8,860,202 B2 | 10/2014 | Chen |
| 2006/0125072 A1 | 6/2006 | Mihara |
| 2009/0134528 A1* | 5/2009 | Lee ........................ H01L 21/486 257/777 |
| 2010/0193930 A1* | 8/2010 | Lee .................... H01L 23/49816 257/686 |
| 2012/0032340 A1 | 2/2012 | Choi et al. |
| 2012/0184646 A1 | 7/2012 | Sumita et al. |

(Continued)

FOREIGN PATENT DOCUMENTS

TW        201245269 A1    11/2012

OTHER PUBLICATIONS

TIPO Office Action dated Apr. 21, 2016 in Taiwan application (No. 104109777).

*Primary Examiner* — Douglas Menz
(74) *Attorney, Agent, or Firm* — McClure, Qualey & Rodack, LLP

(57) ABSTRACT

A semiconductor package structure and a method for manufacturing the same are provided. The semiconductor package structure comprises a substrate, a first chip, a first dielectric layer, a dielectric encapsulation layer and at least one first via. The first chip is disposed on the substrate. The first chip has a first landing area. The first dielectric layer is disposed on the first chip. The dielectric encapsulation layer encapsulates the first chip and the first dielectric layer. The at least one first via penetrates through the dielectric encapsulation layer and the first dielectric layer. The at least one first via connects to the first landing area of the first chip.

13 Claims, 8 Drawing Sheets

(56) References Cited

U.S. PATENT DOCUMENTS

| | | | |
|---|---|---|---|
| 2015/0123288 A1* | 5/2015 | Lee | H01L 23/5389 257/777 |
| 2016/0049385 A1* | 2/2016 | Yu | H01L 23/3128 257/774 |

* cited by examiner

SEMICONDUCTOR PACKAGE STRUCTURE AND METHOD FOR MANUFACTURING THE SAME

TECHNICAL FIELD

This disclosure relates to a semiconductor structure and a method for manufacturing the same. More particularly, this disclosure relates to a semiconductor package structure and a method for manufacturing the same.

BACKGROUND

Wire bonding is a typical method providing interconnections for a semiconductor package structure. However, since the wire is a relative long conductive path, the power consumption and the capacitance become problems. In addition, the wires, the bumps and the pads are space-occupying, and thereby the number and the density of the wires are limited. Further, the cost will become higher as the number of the wires increases.

Through silicon via (TSV), which has been developed in recent years, is another method providing interconnections for a semiconductor package structure. TSV provides interconnections by a silicon substrate with a plurality holes penetrating therethrough. Such a conductive path is shorter, and the density of the conductive path can be very high. However, the manufacturing process is complex, the cost is high, and the yield is a problem.

SUMMARY

This disclosure is directed to a semiconductor package structure, which comprises a new means for providing interconnections, and a method for manufacturing the same.

According to some embodiment, the semiconductor package structure comprises a substrate, a first chip, a first dielectric layer, a dielectric encapsulation layer and at least one first via. The first chip is disposed on the substrate. The first chip has a first landing area. The first dielectric layer is disposed on the first chip. The dielectric encapsulation layer encapsulates the first chip and the first dielectric layer. The at least one first via penetrates through the dielectric encapsulation layer and the first dielectric layer. The at least one first via connects to the first landing area of the first chip.

According to some embodiment, the method for manufacturing a semiconductor package structure comprises the following steps. First, a first chip is disposed on a substrate, and a first dielectric layer is formed on the first chip. The first chip has a first landing area. Then, a dielectric encapsulation layer is formed encapsulating the first chip and the first dielectric layer. At least one first hole is formed through the dielectric encapsulation layer. The at least one first hole is extended through the first dielectric layer to the first landing area of the first chip. Thereafter, a conductor is filled into the at least one first hole to form at least one first via connecting to the first landing area of the first chip.

Figure 1:
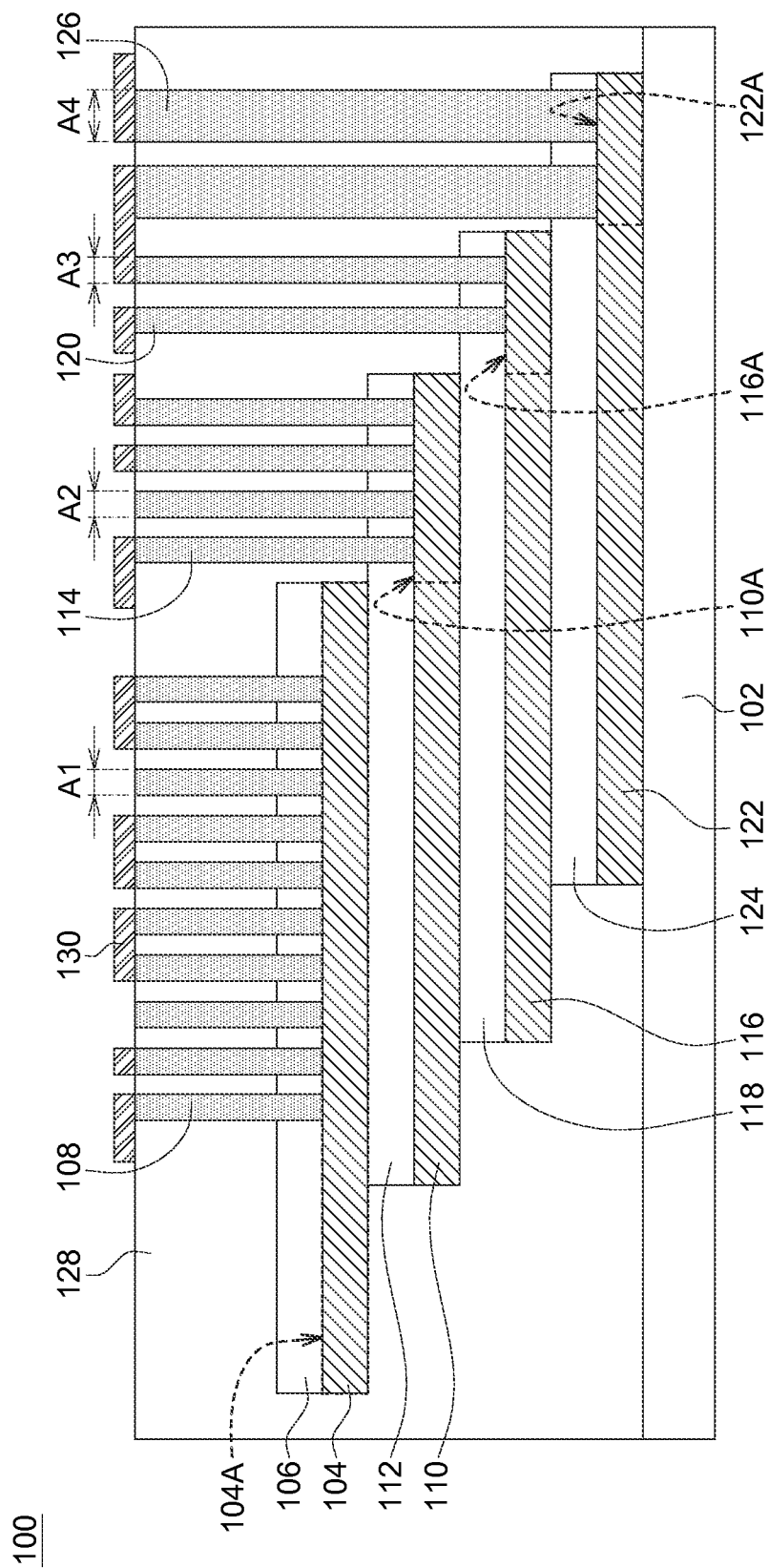
FIG. 1 illustrates a semiconductor package structure according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Referring to FIG. 1, a semiconductor package structure 100 according to one embodiment is shown. The semiconductor package structure 100 comprises a substrate 102, a first chip 104, a first dielectric layer 106, a dielectric encapsulation layer 128 and at least one first via 108. The first chip 104 is disposed on the substrate 102. The first chip 104 has a first landing area 104A. Here, the term "landing area" means the area of the chip which can be connected to a via. The first dielectric layer 106 is disposed on the first chip 104. The dielectric encapsulation layer 128 encapsulates the first chip 104 and the first dielectric layer 106. The first via 108 penetrates through the dielectric encapsulation layer 128 and the first dielectric layer 106. The first via 108 connects to the first landing area 104A of the first chip 104. The semiconductor package structure 100 may further comprise a redistribution layer 130 disposed on the dielectric encapsulation layer 128. The redistribution layer 130 connects to the first via 108.

The semiconductor package structure 100 may further comprise a second chip 110, a second dielectric layer 112 and at least one second via 114. The second chip 110 is disposed between the substrate 102 and the first chip 104. The second chip 110 has a second landing area 110A which is not covered by the first chip 104. The second dielectric layer 112 is disposed between the second chip 110 and the first chip 104. The dielectric encapsulation layer 128 further encapsulates the second chip 110 and the second dielectric layer 112. The second via 114 penetrates through the dielectric encapsulation layer 128 and the second dielectric layer 112. The second via 114 connects to the second landing area 110A of the second chip 110. The redistribution layer 130 further connects to the second via 114.

Figure 2:
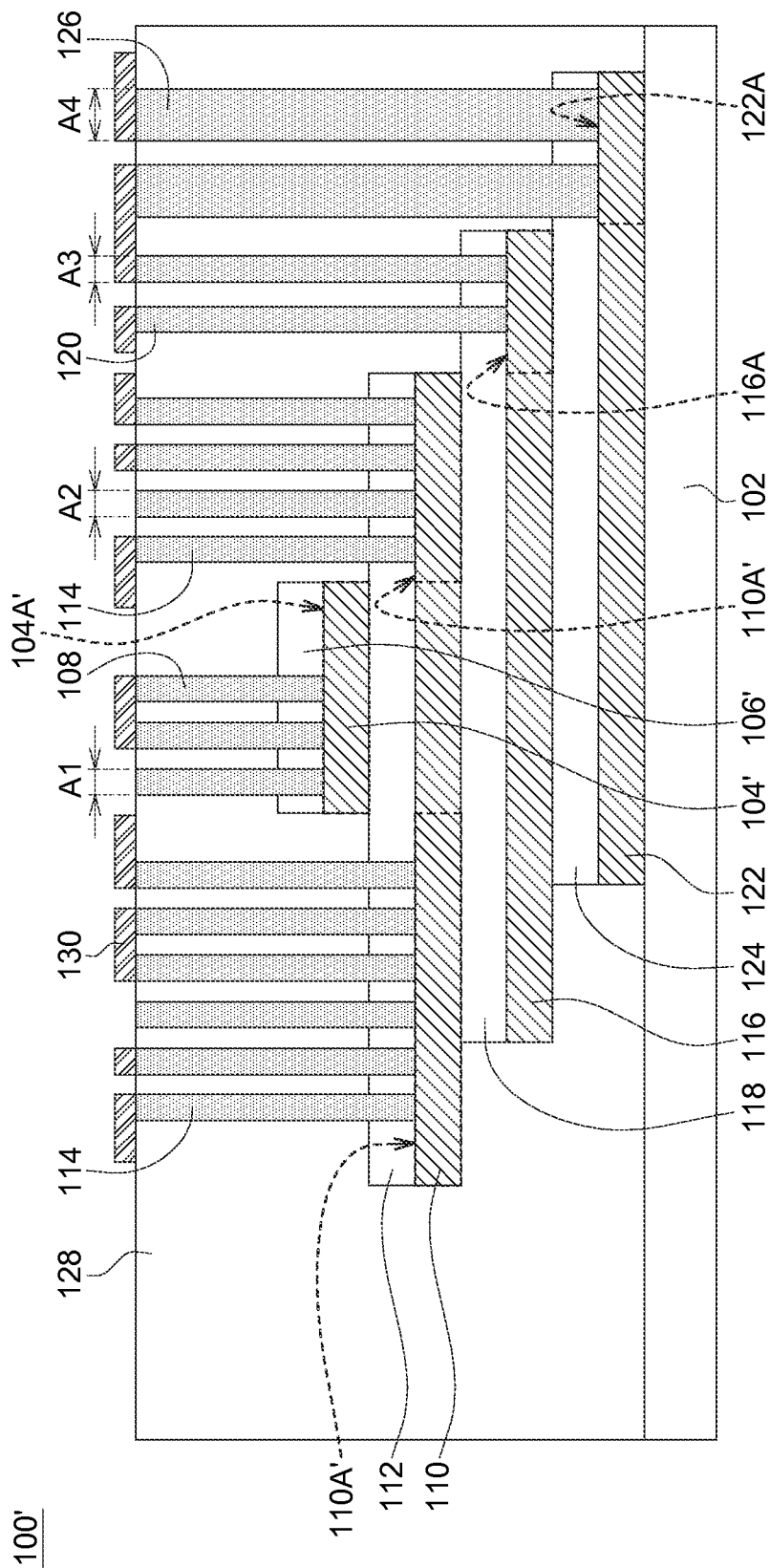
FIG. 2 illustrates a semiconductor package structure according to another embodiment.

In one embodiment, as shown in FIG. 1, the area of the second landing area 110A is equal to or smaller than the area of the first landing area 104A. However, the invention is not limited thereto. As shown in FIG. 2, in the semiconductor package structure 100', the first chip 104' and the first dielectric layer 106' having smaller sizes may be disposed at the top. At this time, the area of the second landing area 110A' may be larger than the area of the first landing area 104A'. In one embodiment, as shown in FIG. 1, the number of the second via(s) 114 is equal to or less than the number of the first via(s) 108. However, the invention is not limited thereto. As shown in FIG. 2, the number of the second via(s) 114 may be more than the number of the first via(s) 108. In one embodiment, as shown in FIG. 1, the cross-sectional area A2 of the second via 114 is equal to or larger than the cross-sectional area A1 of the first via 108. However, the invention is not limited thereto.

The semiconductor package structure 100 may further comprise a third chip 116, a third dielectric layer 118 and at least one third via 120. The third chip 116 is disposed between the substrate 102 and the second chip 110. The third chip 116 has a third landing area 116A which is not covered by the second chip 110. The third dielectric layer 118 is disposed between the third chip 116 and the second chip 110.

The dielectric encapsulation layer 128 further encapsulates the third chip 116 and the third dielectric layer 118. The third via 120 penetrates through the dielectric encapsulation layer 128 and the third dielectric layer 118. The third via 120 connects to the third landing area 116A of the third chip 116. The redistribution layer 130 further connects to the third via 120.

In one embodiment, as shown in FIG. 1, the area of the third landing area 116A is equal to or smaller than the area of the second landing area 110A. In one embodiment, as shown in FIG. 1, the number of the third via(s) 120 is equal to or less than the number of the second via(s) 114. In one embodiment, as shown in FIG. 1, the cross-sectional area A3 of the third via 120 is equal to or larger than the cross-sectional area A2 of the second via 114. However, the invention is not limited thereto.

The semiconductor package structure 100 may further comprise a fourth chip 122, a fourth dielectric layer 124 and at least one fourth via 126. The fourth chip 122 is disposed between the substrate 102 and the third chip 116. The fourth chip 122 has a fourth landing area 122A which is not covered by the third chip 116. The fourth dielectric layer 124 is disposed between the fourth chip 122 and the third chip 116. The dielectric encapsulation layer 128 further encapsulates the fourth chip 122 and the fourth dielectric layer 124. The fourth via 126 penetrates through the dielectric encapsulation layer 128 and the fourth dielectric layer 124. The fourth via 126 connects to the fourth landing area 122A of the fourth chip 122. The redistribution layer 130 further connects to the fourth via 126.

In one embodiment, as shown in FIG. 1, the area of the fourth landing area 122A is equal to or smaller than the area of the third landing area 116A. In one embodiment, as shown in FIG. 1, the number of the fourth via(s) 126 is equal to or less than the number of the third via(s) 120. In one embodiment, as shown in FIG. 1, the cross-sectional area A4 of the fourth via 126 is equal to or larger than the cross-sectional area A3 of the third via 120. However, the invention is not limited thereto.

According to one embodiment, the redistribution layer 130 may be formed of copper (Cu) or tungsten (W). According to one embodiment, the first via 108, the second via 114, the third via 120 and the fourth via 126 may be formed of Cu or W. According to one embodiment, the first dielectric layer 106, the second dielectric layer 112, the third dielectric layer 118 and the fourth dielectric layer 124 are formed of a material different from a material of the dielectric encapsulation layer 128. For example, the first dielectric layer 106, the second dielectric layer 112, the third dielectric layer 118 and the fourth dielectric layer 124 may be formed of oxide, and the dielectric encapsulation layer 128 may be formed of photosensitive polyimide.

Now referring to FIG. 3A-FIG. 3F, a method for manufacturing a semiconductor package structure 100 according to one embodiment is shown.

Figure 3A:
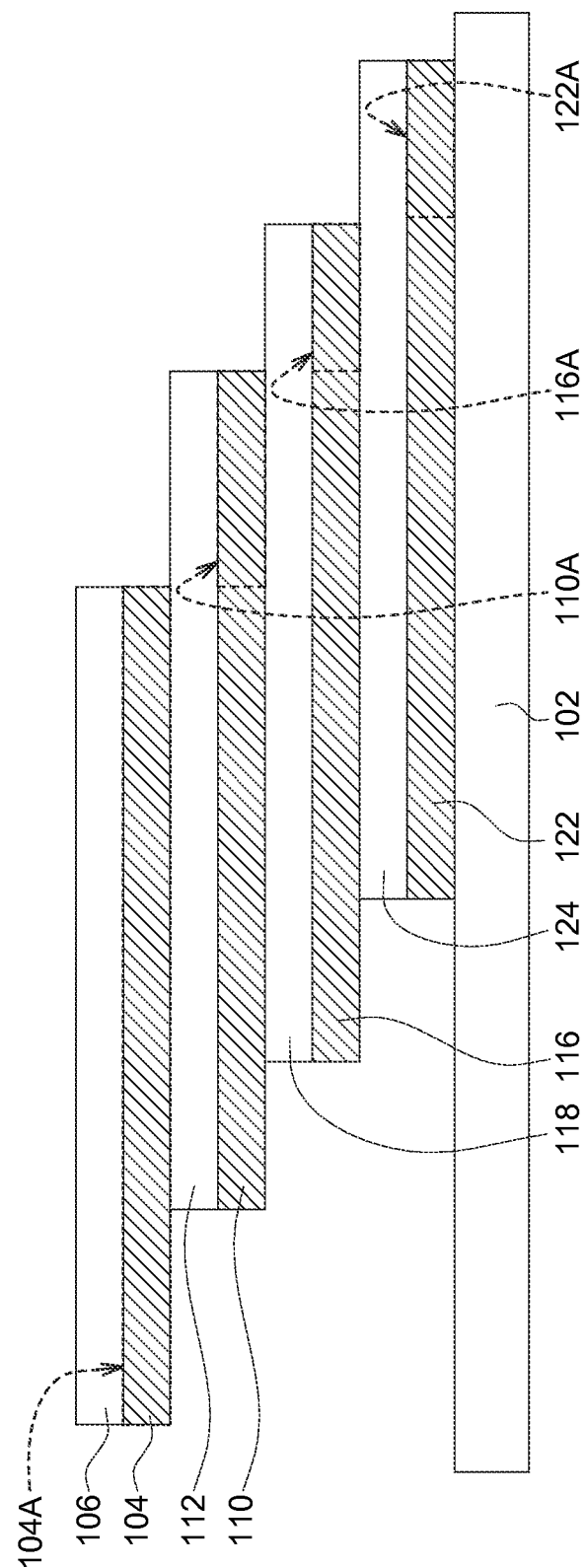
FIG. 3A-FIG. 3F illustrate a method for manufacturing a semiconductor package structure according to one embodiment.

Referring to FIG. 3A, a first chip 104 is disposed on a substrate 102, and a first dielectric layer 106 is formed on the first chip 104. The first chip 104 has a first landing area 104A. Further, a second chip 110 may be disposed between the substrate 102 and the first chip 104, and a second dielectric layer 112 may be formed between the second chip 110 and the first chip 104. The second chip 110 has a second landing area 110A which is not covered by the first chip 104. A third chip 116 may be disposed between the substrate 102 and the second chip 110, and a third dielectric layer 118 may be formed between the third chip 116 and the second chip 110. The third chip 116 has a third landing area 116A which is not covered by the second chip 110. A fourth chip 122 may be disposed between the substrate 102 and the third chip 116, and a fourth dielectric layer 124 may be formed between the fourth chip 122 and the third chip 116. The fourth chip 122 has a fourth landing area 122A which is not covered by the third chip 116. In one embodiment, the first dielectric layer 106, the second dielectric layer 112, the third dielectric layer 118 and the fourth dielectric layer 124 is formed of oxide.

According to one embodiment, the area of the first landing area 104A may be equal to or larger than the area of the second landing area 110A, the area of the second landing area 110A may be equal to or larger than the area of the third landing area 116A, and/or the area of the third landing area 116A may be equal to or larger than the area of the fourth landing area 122A. As such, the chip needing more interconnections can be placed at the top and have a bigger landing area.

Figure 3B:
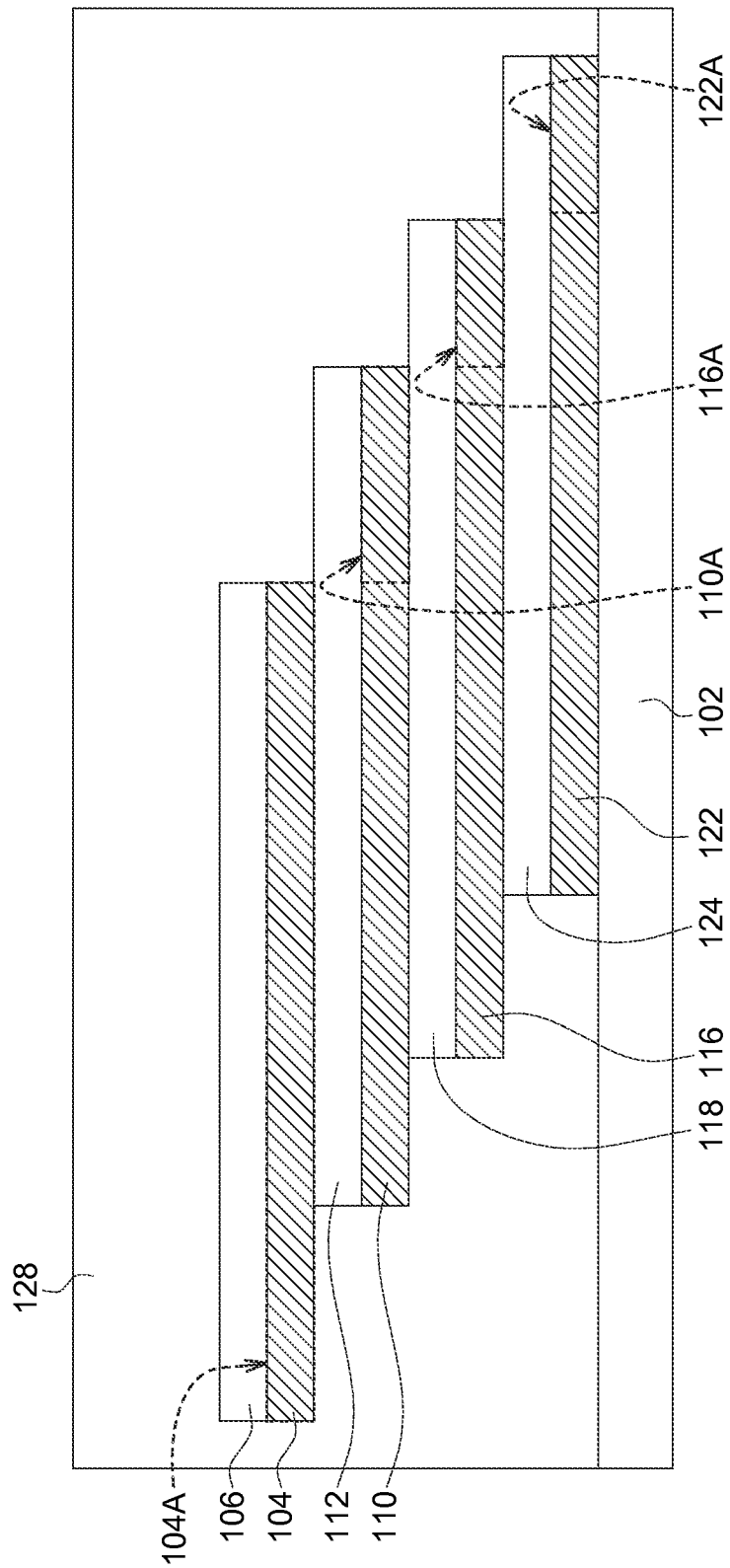

Referring to FIG. 3B, a dielectric encapsulation layer 128 is formed. The dielectric encapsulation layer 128 encapsulates the first chip 104 and the first dielectric layer 106. The dielectric encapsulation layer 128 may further encapsulate the second chip 110, the second dielectric layer 112, the third chip 116, the third dielectric layer 118, the fourth chip 122 and the fourth dielectric layer 124. The dielectric encapsulation layer 128 may be formed of a material different from a material of the first dielectric layer 106, the second dielectric layer 112, the third dielectric layer 118 and the fourth dielectric layer 124. In one embodiment, the dielectric encapsulation layer 128 is formed of photosensitive polyimide, which is easy to be processed and cost-competitive. However, other materials may be used.

Figure 3C:
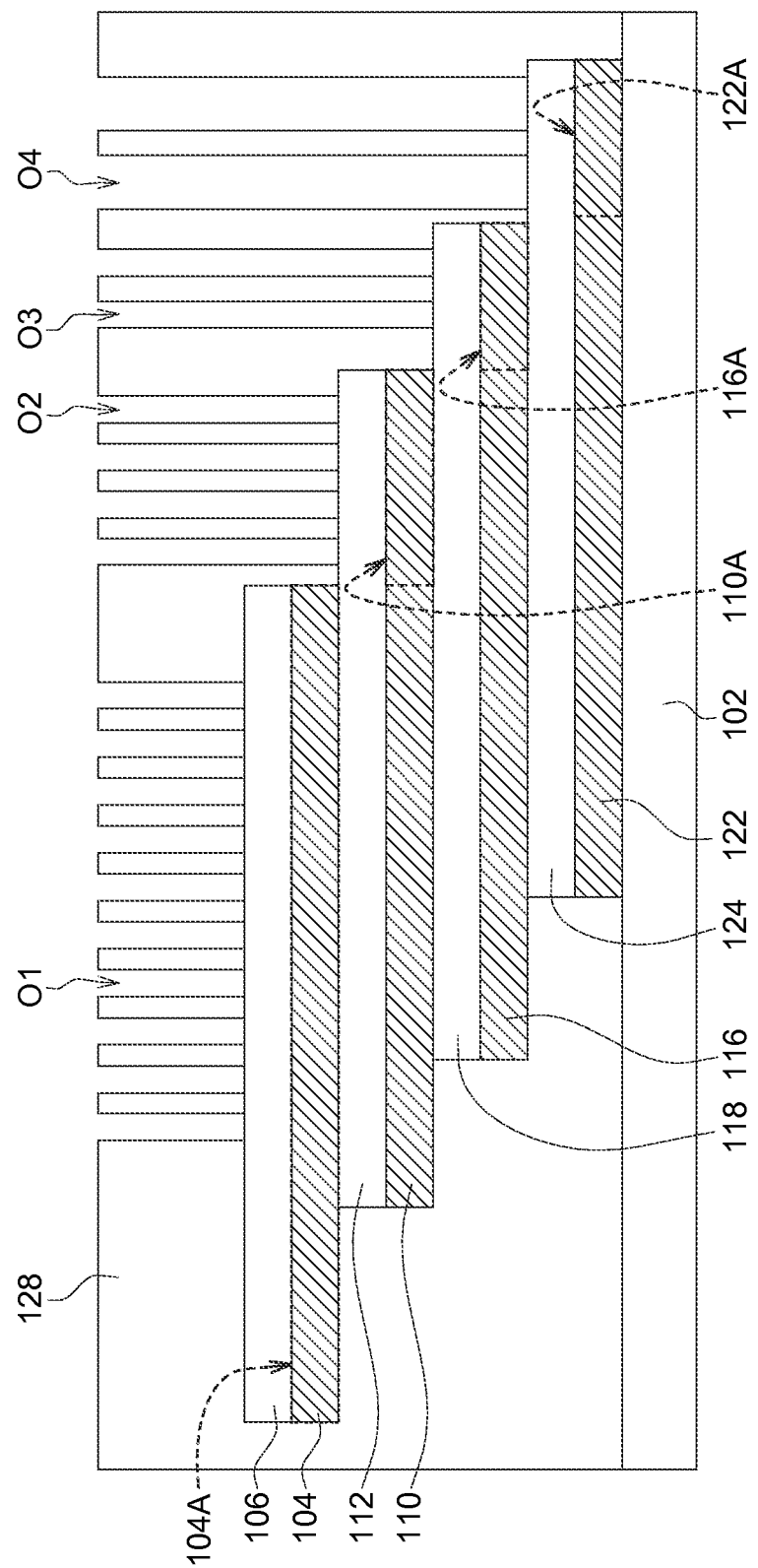

Referring to FIG. 3C, at least one first hole O1 is formed through the dielectric encapsulation layer 128. At least one second hole O2, at least one third hole O3 and at least one fourth hole O4 may be concurrently formed through the dielectric encapsulation layer 128. The first hole O1, the second hole O2, the third hole O3 and the fourth hole O4 correspond to the first landing area 104A, the second landing area 110A, the third landing area 116A and the fourth landing area 122A, respectively. The first hole O1, the second hole O2, the third hole O3 and the fourth hole O4 may be formed by a lithography process. Optionally, a baking process may be conducted (this process is not needed for photosensitive polyimide).

According to one embodiment, the number of the first hole(s) O1 may be equal to or more than the number of the second hole(s) O2, the number of the second hole(s) O2 may be equal to or more than the number of the third hole(s) O3, and/or the number of the third hole(s) O3 may be equal to or more than the number of the fourth hole(s) O4. As such, the chip at the top, which may need more interconnections, can be provided with more vias.

According to one embodiment, the cross-sectional area of the first hole O1 may be equal to or smaller than the cross-sectional area of the second hole O2, the cross-sectional area of the second hole O2 may be equal to or smaller than the cross-sectional area of the third hole O3, and/or the cross-sectional area of the third hole O3 may be equal to or smaller than the cross-sectional area of the fourth hole O4. Since the chip needing more interconnections may be disposed at the top, the holes corresponding to it can be shallower. As such, these holes can have a smaller cross-sectional area, thus the density of these holes can be increased. While the deeper holes may have a larger cross-sectional area, thus a larger process window can be obtained.

Figure 3D:
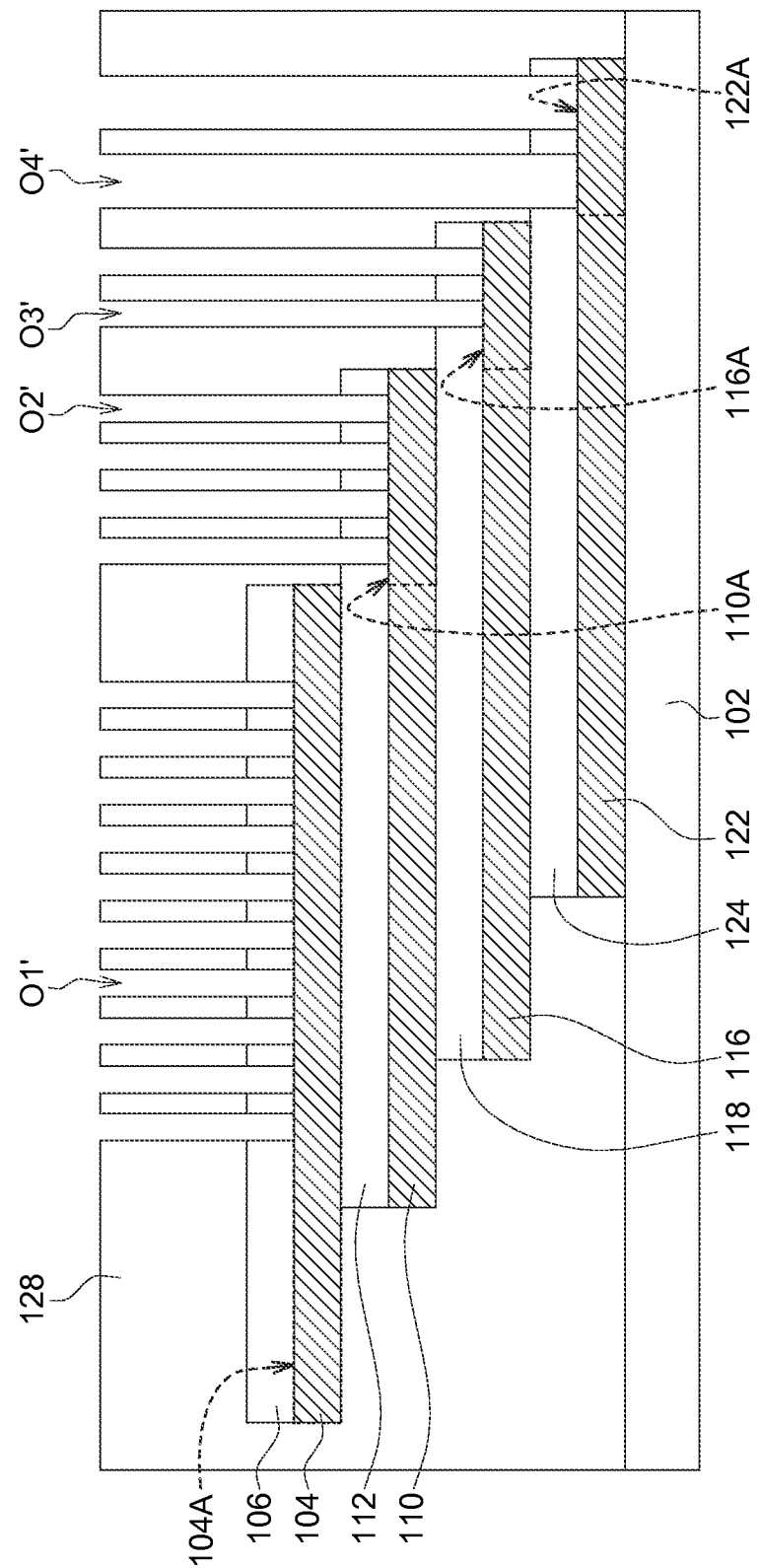

Referring to FIG. 3D, the first hole O1 is extended through the first dielectric layer 106 to the first landing area 104A of the first chip 104. Concurrently, the second hole O2 may be extended through the second dielectric layer 112 to the second landing area 110A of the second chip 110, the third hole O3 may be extended through the third dielectric layer 118 to the third landing area 116A of the third chip 116, and the fourth hole O4 may be extended through the fourth dielectric layer 124 to the fourth landing area 122A of the fourth chip 122. The extended first hole O1', second hole O2', third hole O3' and fourth hole O4' may be formed by an etching process. Compared to the TSV formed through a silicon substrate, the first hole O1', the second hole O2', the third hole O3' and the fourth hole O4' can be formed easier, and thereby the yield will not become a problem. In addition, since only a lithography process and an etching process are conducted, the cost can be decreased.

Figure 3E:
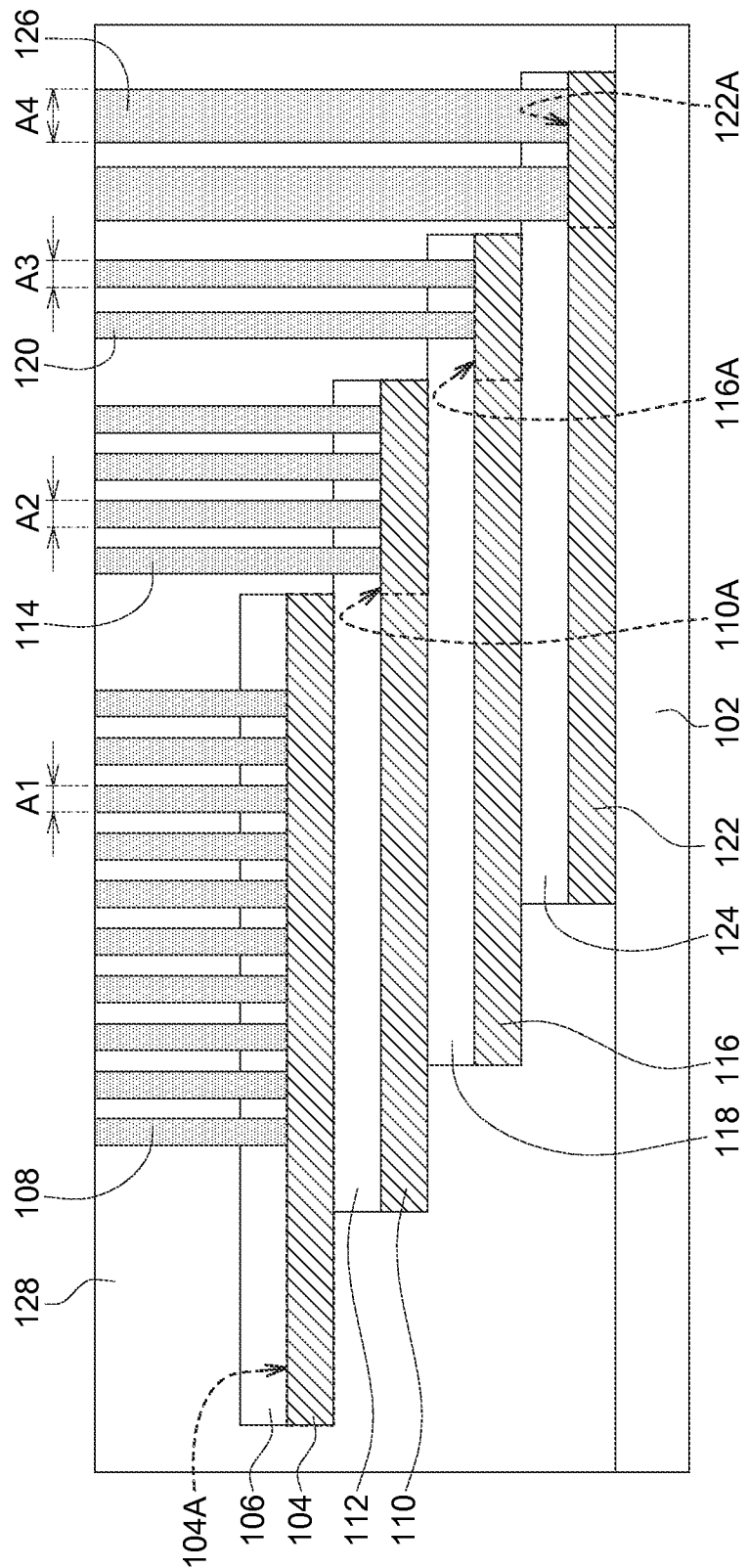

Referring to FIG. 3E, a conductor is filled into the first hole O1' to form at least one first via 108 connecting to the first landing area 104A of the first chip 104. Concurrently, the conductor may be filled into the second hole O2' to form at least one second via 114 connecting to the second landing area 110A of the second chip 110, be filled into the third hole O3' to form at least one third via 120 connecting to the third landing area 116A of the third chip 116, and be filled into the fourth hole O4' to form at least one fourth via 126 connecting to the fourth landing area 122A of the fourth chip 122. The conductor may be, for example, Cu or W.

The number of the first via(s) 108 may be equal to or more than the number of the second via(s) 114, the number of the second via(s) 114 may be equal to or more than the number of the third via(s) 120, and/or the number of the third via(s) 120 may be equal to or more than the number of the fourth via(s) 126. The cross-sectional area A1 of the first via 108 may be equal to or smaller than the cross-sectional area A2 of the second via 114, the cross-sectional area A2 of the second via 114 may be equal to or smaller than the cross-sectional area A3 of the third via 120, and/or the cross-sectional area A3 of the third via 120 may be equal to or smaller than the cross-sectional area A4 of the fourth via 126.

Since the first via 108, the second via 114, the third via 120 and the fourth via 126 may be formed by the same steps, the cost will not be affected by the number and the sizes of these vias. Further, the first via 108, the second via 114, the third via 120 and the fourth via 126 may have a cross-sectional area about only 2 μm×2 μm, which is much smaller than a typical pad size used in wire bonding (for example, 60 μm×60 μm), thus the density of the conductive paths can be increased significantly.

Figure 3F:
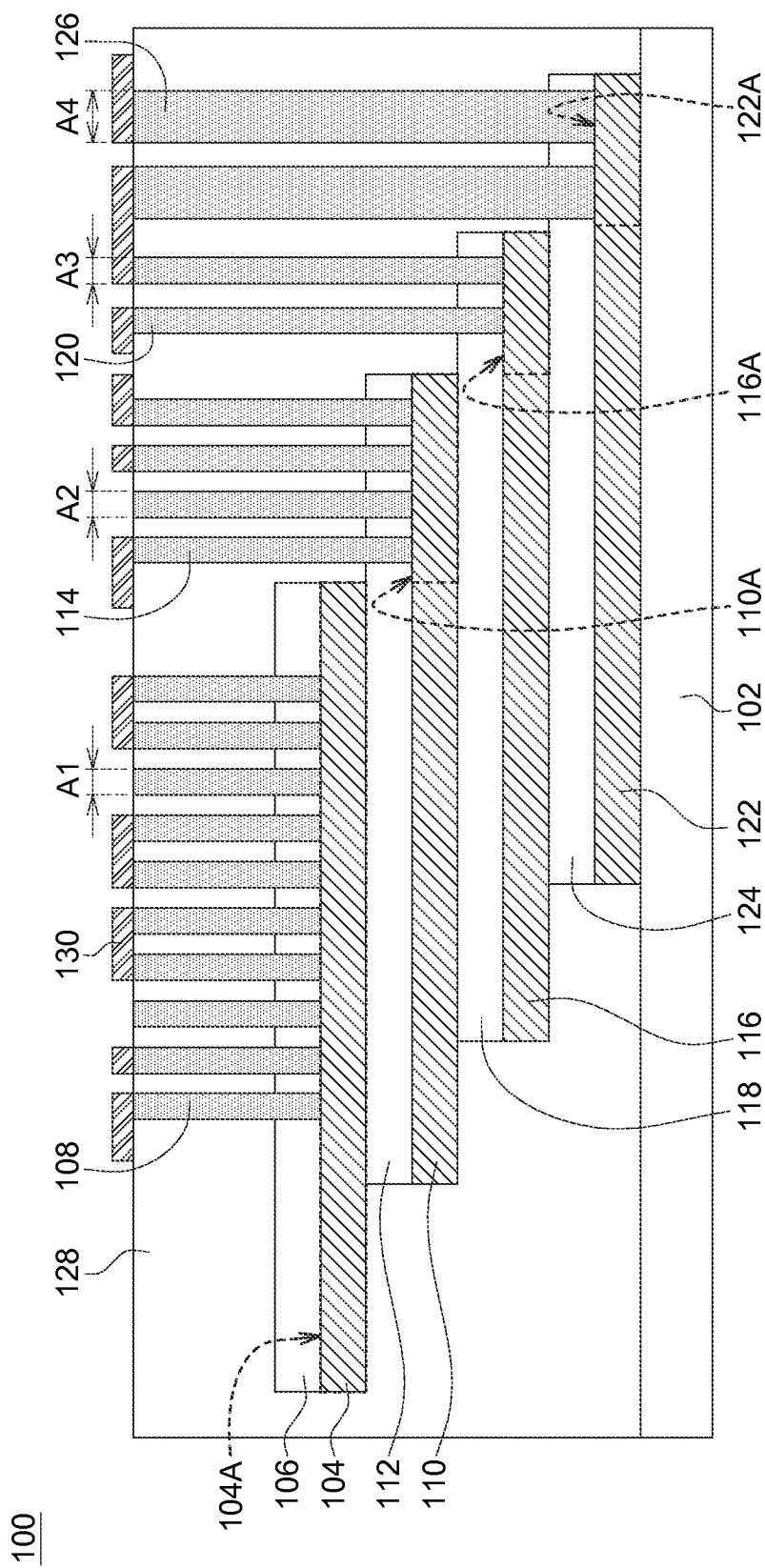

Referring to FIG. 3F, a redistribution layer 130 may be formed on the dielectric encapsulation layer 128. The redistribution layer 130 connects to the first via 108. The redistribution layer 130 may further connect to the second via 114, the third via 120 and the fourth via 126. The redistribution layer 130 may be formed of Cu or W.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor package structure, comprising:
    a substrate;
    a first chip disposed on the substrate, the first chip having a first landing area;
    a first dielectric layer disposed on the first chip;
    a dielectric encapsulation layer encapsulating the first chip and the first dielectric layer;
    a plurality of first vias penetrating through the dielectric encapsulation layer and the first dielectric layer, the plurality of first vias connecting to the first landing area of the first chip;
    a second chip disposed between the substrate and the first chip, the second chip having a second landing area which is not covered by the first chip;
    a second dielectric layer disposed between the second chip and the first chip, wherein the dielectric encapsulation layer further encapsulating the second chip and the second dielectric layer; and
    at least one second via penetrating through the dielectric encapsulation layer and the second dielectric layer, the at least one second via connecting to the second landing area of the second chip,
    wherein a number of the at least one second via is less than a number of the plurality of first vias.

2. The semiconductor package structure according to claim 1, further comprising:
    a redistribution layer disposed on the dielectric encapsulation layer, the redistribution layer connecting to the plurality of first vias.

3. The semiconductor package structure according to claim 2,
    wherein the redistribution layer further connects to the at least one second via.

4. The semiconductor package structure according to claim 3, wherein an area of the second landing area is equal to or smaller than an area of the first landing area.

5. The semiconductor package structure according to claim 3, further comprising:
    a third chip disposed between the substrate and the second chip, the third chip having a third landing area which is not covered by the second chip;
    a third dielectric layer disposed between the third chip and the second chip, wherein the dielectric encapsulation layer further encapsulating the third chip and the third dielectric layer; and
    at least one third via penetrating through the dielectric encapsulation layer and the third dielectric layer, the at least one third via connecting to the third landing area of the third chip, wherein the redistribution layer further connects to the at least one third via.

6. The semiconductor package structure according to claim 5, further comprising:
    a fourth chip disposed between the substrate and the third chip, the fourth chip having a fourth landing area which is not covered by the third chip;
    a fourth dielectric layer disposed between the fourth chip and the third chip, wherein the dielectric encapsulation layer further encapsulating the fourth chip and the fourth dielectric layer; and
    at least one fourth via penetrating through the dielectric encapsulation layer and the fourth dielectric layer, the at least one fourth via connecting to the fourth landing area of the fourth chip, wherein the redistribution layer further connects to the at least one fourth via.

7. The semiconductor package structure according to claim 6, wherein an area of the third landing area is equal to or smaller than an area of the second landing area, an area of the fourth landing area is equal to or smaller than the area of the third landing area, a number of the at least one third via is equal to or less than a number of the at least one second via, a number of the at least one fourth via is equal to or less than the number of the at least one third via, a cross-sectional area of the at least one third via is equal to or larger than a cross-sectional area of the at least one second via, and a cross-sectional area of the at least one fourth via is equal to or larger than the cross-sectional area of the at least one third via.

8. The semiconductor package structure according to claim 2, wherein the redistribution layer is formed of Cu or W.

9. The semiconductor package structure according to claim 1, wherein the plurality of first vias are formed of Cu or W.

10. The semiconductor package structure according to claim 1, wherein the first dielectric layer and the dielectric encapsulation layer are formed of different materials.

11. The semiconductor package structure according to claim 10, wherein the first dielectric layer is formed of oxide.

12. The semiconductor package structure according to claim 10, wherein the dielectric encapsulation layer is formed of photosensitive polyimide.

13. A semiconductor package structure, comprising:

a substrate;

a first chip disposed on the substrate, the first chip having a first landing area;

a first dielectric layer disposed on the first chip;

a dielectric encapsulation layer encapsulating the first chip and the first dielectric layer;

at least one first via penetrating through the dielectric encapsulation layer and the first dielectric layer, the at least one first via connecting to the first landing area of the first chip;

a second chip disposed between the substrate and the first chip, the second chip having a second landing area which is not covered by the first chip;

a second dielectric layer disposed between the second chip and the first chip, wherein the dielectric encapsulation layer further encapsulating the second chip and the second dielectric layer;

at least one second via penetrating through the dielectric encapsulation layer and the second dielectric layer, the at least one second via connecting to the second landing area of the second chip, a third chip disposed between the substrate and the second chip, the third chip having a third landing area which is not covered by the second chip;

a third dielectric layer disposed between the third chip and the second chip, wherein the dielectric encapsulation layer further encapsulating the third chip and the third dielectric layer; and at least one third via penetrating through the dielectric encapsulation layer and the third dielectric layer, the at least one third via connecting to the third landing area of the third chip, wherein a cross-sectional area of the at least one second via is larger than a cross-sectional area of the at least one first via, and the second landing area is larger than the third landing area.

* * * * *